(12) United States Patent
Matumoto et al.

(10) Patent No.: US 7,629,908 B2
(45) Date of Patent: Dec. 8, 2009

(54) D/A CONVERSION CIRCUIT, ORGANIC EL DRIVE CIRCUIT AND ORGANIC EL DISPLAY DEVICE

(75) Inventors: Kouichi Matumoto, Kyoto (JP); Shinichi Abe, Kyoto (JP); Yuji Shimada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 61 days.

(21) Appl. No.: 12/067,811

(22) PCT Filed: Sep. 26, 2006

(86) PCT No.: PCT/JP2006/319036

§ 371 (c)(1),
(2), (4) Date: Mar. 24, 2008

(87) PCT Pub. No.: WO2007/037220

PCT Pub. Date: Apr. 5, 2007

(65) Prior Publication Data

US 2009/0179783 A1 Jul. 16, 2009

(30) Foreign Application Priority Data

Sep. 27, 2005 (JP) .............................. 2005-279681

(51) Int. Cl.
*H03M 1/66* (2006.01)
*H03M 1/68* (2006.01)

(52) U.S. Cl. ...................................... 341/135; 341/145

(58) Field of Classification Search .................. 341/135, 341/136, 145
See application file for complete search history.

(56) References Cited

U.S. PATENT DOCUMENTS

| 4,594,577 A * | 6/1986 | Mao ........................... 341/135 |
| 4,931,795 A * | 6/1990 | Gord .......................... 341/135 |
| 6,958,719 B2 * | 10/2005 | Moon ......................... 341/135 |
| 7,477,217 B2 * | 1/2009 | Maede et al. ................. 345/76 |

FOREIGN PATENT DOCUMENTS

| JP | 60130220 A | * | 7/1985 |
| JP | 2003-234655 | | 8/2003 |
| JP | 2004037656 A | * | 2/2004 |

\* cited by examiner

*Primary Examiner*—Howard Williams
(74) *Attorney, Agent, or Firm*—Mattingly & Malur, PC

(57) ABSTRACT

A D/A converter of the current switching type has a first current mirror circuit that D/A converts the upper (n–m) digits in n bit data to be converted and a weighting current circuit block or a second current mirror circuit that D/A converts the lower m digits in the data, by cascade connecting the weighting current circuit block or the second current mirror circuit at the upstream or at the downstream side of an output side transistor other than the output side transistors of the first current mirror circuit. In this manner, current flowing through the output side transistor flows as diverting currents to the weighting current circuit block or the second current mirror circuit corresponding to the digit weights of the lower m digits, and the diverting currents are taken out at the outputs of the D/A conversion circuit as analog converted currents of the lower m digits.

18 Claims, 3 Drawing Sheets

D/A CONVERSION CIRCUIT, ORGANIC EL DRIVE CIRCUIT AND ORGANIC EL DISPLAY DEVICE

FIELD OF THE INVENTION

The present invention relates to a D/A conversion circuit, an organic EL drive circuit and an organic EL display device, and more specifically, relates to a D/C conversion circuit utilizing a current mirror circuit which permits a low voltage drive, shows a high conversion accuracy and is capable of limiting the occupation area thereof when the same is formed into an IC. Further, the present invention relates to an organic EL drive device that is a current drive circuit which produces drive currents in response to display data by the D/A conversion circuit utilizing the current mirror circuit, outputs the same to terminal pins of an organic EL panel and drives column lines (drive lines at the side of positive electrodes of organic EL elements, the same is true in the followings) or data lines, and that permits to suppress such as variation in brightness for every product of display devices and nonuniformity in brightness of the display devices and further permits easy γ correction of display brightness.

BACKGROUND ART

For an organic EL display panel in an organic EL display device which is mounted on such as a cellular phone, PHS, DVD player and PDA (Personal Digital Assistant), one having 396 (132×3) terminal pins as the number of column lines and 162 terminal pins as the number of row lines is proposed and the number of the terminal pins for the column lines and the row lines tends to increase more than the above number.

As a drive circuit for such organic EL display panel, JP-A-2003-234655 (patent document 1) of the present assignee discloses a provision of D/A conversion circuits (herein below will be called as D/A) corresponding to respective column pins. In the document, the D/As corresponding to the respective column pins receive display data and a reference drive current, D/A convert the display data according to the reference drive current and produce drive currents in column direction for respective corresponding column pins or original currents for the drive currents.

Patent document 1: Gazette of JP-A-2003-234655

In the organic EL drive circuit as disclosed in the patent document 1, in order to reduce power consumption, the power source voltage of the D/A is suppressed low, for example, to about DC 3V, only the power source voltage at only the final output stage current source is determined, for example, as DC 15V~20V, the respective D/As provided for the respective corresponding column pins (or respective output terminals of a driver IC) receive the reference drive current distributed to the respective corresponding column pins (or respective output terminals of a driver IC) to produce the original currents of the drive currents for organic EL elements (herein below will be called as OEL element) and to drive the output stage current source. Thereby, power consumption in total current drive circuits is suppressed low.

However, when the circuit is formed into an LC, since the D/As have to be provided for respective corresponding pins, the number of converting bits is limited to about 4 bits~6 bits until now so as to suppress the occupation area thereby.

SUMMARY OF THE INVENTION

Tasks to be Solved by the Invention

As in the organic EL drive circuit as disclosed in the patent document 1, when the output stage current source is driven by making use of the D/As of about 4 bits~6 bits as the converting bit number to current drive the OEL elements, variation in the drive currents for the respective column pins or the respective corresponding output terminals is caused in the organic EL drive circuit because of poor current conversion accuracy of the D/As, which induces variation in brightness for every product of display devices and nonuniformity in brightness of the display devices that is a problem.

Now, like in the case of CRT tubes, the brightness of the respective OEL elements in the organic EL display panel does not show a linear relationship with respect to drive currents generated in response to the values of display data but shows a curved relationship corresponding to a light emitting characteristic of the material for the OEL elements used as R, G and B. Further, the higher the resolution of the organic EL display panel becomes, the more remarkable the variation in image quality of the display screen becomes. For this reason, the γ correction of the display brightness is necessitated.

When performing the γ correction of the display brightness, it is usually conceived to correct display data set at the D/A conversion circuits through a software processing inside of such as a driver, however, in the case of the D/As of about 4 bits~6 bits, the γ correction can not be performed because of the limited conversion bit number that is a problem. For this reason, γ correction circuits are provided for the respective corresponding pins, however, because of the increase of the γ correction circuits, the occupation area of the current drive circuit increases that is a problem.

Therefore, the present assignee applied PCT/JP2005/5673 titled "D/A Conversion Circuit, Organic EL Drive Circuit and Organic EL Display Device" as an invention for solving these problems. Not limited to the demand from the γ correction, but from demand of high accuracy and high fineness, a conversion bit number of the D/As more than 6 bits is required, however, when the bit number is increased to 7 bits or more, a number of pins allocated for one piece of IC is limited because of an increase of occupation area by the D/As, therefore, a number of driver ICs has to be increased in response to the increase of the number of column pins for one scan line.

An object of the present invention is to solve these problems in the conventional art and to provide a D/A that permits to be driven under a low voltage and realizes high conversion accuracy as well as permits to limit the occupation area when the same is formed into an IC.

Another object of the present invention is to provide an organic EL drive circuit and an organic EL display device that permit to suppress such as brightness variation and brightness nonuniformity in the display device and are suitable for high accuracy and fineness display.

Still another object of the present invention is to provide an organic EL drive circuit and an organic EL display device that permit easy γ correction for the display brightness.

Measures for Solving the Tasks

A constitution of a D/A, an organic EL drive circuit and an organic EL display device according to a first aspect of the present invention that achieves these objects is that in a D/A converter constituted by a current mirror circuit D/A converting data to be converted, the current mirror circuit includes a first current mirror circuit that D/A converts upper (n-m)

digits in n bit data to be converted (wherein n is an integer equal to or more than 4, m is an integer equal to or more than 2 and (n−m) is an integer equal to or more than 2) and a weighting current circuit block that D/A converts lower m digits in the data, and the weighting current circuit block is provided with at least m pieces of current diverting circuits which are cascade connected at the upstream or the downstream of one of other output side transistors than output side transistors for the D/A conversion in the first current mirror circuit and cause to flow currents flowing through the other output side transistors as diverting currents corresponding to current values of respective digit weights in the lower m digits and a selection circuit that selectively outputs the respective diverting currents flowing respectively through the m pieces of current diverting circuits to output terminals for analog converted currents in the first current mirror circuit.

In a constitution according to a second aspect of the present invention, the current mirror circuit functions as a first current mirror circuit and the weighting current circuit block functions as a second current mirror circuit of which input side transistor is not diode connected.

The first current mirror circuit includes plural output side transistors each of which corresponds to respective digit positions of upper (n−m) digits in n bit data to be converted (wherein, m is an integer equal to or more than 2 and (n−m) is an integer equal to or more than 2) and other output side transistors provided in parallel with the plural output side transistors, and the plural output side transistors respectively generate respective currents corresponding to current values of respective digit weights in the (n−m) digits.

The second current mirror circuit is cascade connected at the upstream side or at the downstream side of the other output side transistor and the commonly connected bases of the input side transistor and the plural output side transistors thereof are set at a predetermined constant voltage, and by distributing current having been flown through the other output side transistor or current to be flown thereto to the input side transistor in the second current mirror circuit and the plural output side transistors thereof, the plural output side transistors in the second current mirror circuit respectively generate respective currents corresponding to the current values of respective digit weights in the m digits.

ADVANTAGES OF THE INVENTION

According to the present invention, in the D/A (current switching type D/A) constituted by a current mirror circuit, the first current mirror circuit that D/A converts upper (n−m) digits in n bit data to be converted and the weighting current circuit block or the second current mirror circuit that D/A converts lower m digits in the data are provided, by cascade connecting the weighting current circuit block or the second current mirror circuit at the upstream or at the downstream of the other output side transistor than the output side transistors in the first current mirror circuit, the currents flowing through the other output side transistors flow as the diverting currents to the weighting current circuit block or the second current mirror circuit in corresponding to the digit weights of the lower m digits, and the diverting currents are taken out at the outputs of the D/A conversion circuits as the analog converted currents of the lower m digits.

In the current mirror circuit type D/A conversion circuit, the weight values from the units digit position to the maximum digit position increase by powers of 2 with respect to a digit immediately before in a manner 1, 2, 4, 8, 16, . . . . For this reason, although the number of the output side transistors that produce the analog converted currents in corresponding to the digit weights increases, when the circuits, which divert currents flowing through the other output side transistors than the output side transistors in the current mirror circuit of D/A conversion in corresponding to the digit weights in the lower m digits as referred above, are provided, the number of conversion digits of the first current mirror circuit in the current mirror circuit type D/A conversion circuit limited to that for the upper (n−m) digits, thereby, the number of transistors can be reduced correspondingly. In addition the number of transistors that constitute the weighting current circuit block or the second current mirror circuit performing D/A conversion for the lower m digits is sufficient that for the m digits.

When explaining specifically, in the case when constituting the current mirror circuit type D/A by connecting transistors having same characteristics in parallel, the number of entire transistor cells primarily assumes nth power of $\Sigma 2$ (n=1~n). However, when the digits are divided into upper digits and lower digits in relation to the upstream and the downstream as referred to above and, for example, m is determined to cover lower digits below units digit, the number of total transistor cells is given as (n−m) th power of $\Sigma 2$ (n=1~(n−m))+mth power of $\Sigma 2$ (m=1~m)+2. Thereby, the number of the transistors is significantly reduced.

Wherein, the last term "2" in the above equation represents the sum number of the other output transistor provided in the first current mirror circuit and the input side transistor in the second current mirror circuit when the weighting current circuit block is constituted by a current mirror circuit of which input side transistor is not diode connected according to the second aspect of the present invention.

For example, in the case of 8 digits, the number of transistor cells is conventionally nth power of $\Sigma 2$ (n=1~n)=255, however, according to the present invention, when assuming m=4, the number of transistor cells of 32 is sufficient for the upper digits and that for the lower digits is about 16, therefore, the number of transistors of about 48 in total is sufficient.

Even when m is assigned to an upper digit than unit digit, a small number of transistor cells is sufficient in comparison with the conventional one. the digit weights below unit digit are given as ½(=0.5), ¼ (=0.25), ⅛ (0.125), . . . , however, even when m is assigned to a further lower digit position than the unit digit, for example, digit position of ¼ (=0.25) or lower, the number of transistor cells is reduced likely.

In the D/A according to the present invention in the above cases, on the output side transistors of the D/A conversion block in one current mirror circuit, the D/A conversion block of the weighting current circuit block or another current mirror circuit is cascade connected, and then, the circuit of the D/A is completed only when such as a selection circuit or plural change-over switch circuits are further provided to the later circuit.

As a result, the present invention realizes a D/A that permits to be driven under a low voltage and achieves high conversion accuracy as well as permits to limit the occupation area when the same is formed into an IC. Further, when constituting a current drive circuit that produces drive currents in response to display data by making use of the D/A and when driving column lines or data lines for outputting to terminal pins of an organic EL panel, brightness variation and brightness nonuniformity of a display device using the organic EL panel can be suppressed. Further, in this instance, when the conversion bit number of the D/A is, for example, determined as 8 bits or more, display data subjected to γ correction can be obtained in the present invention. Thereby, a current drive circuit that facilitates γ correction for respective corresponding output terminals is realized and a possible increase of occupation area of the current drive circuit can be suppressed.

BEST MODES FOR CARRYING OUT THE INVENTION

FIG. 1 is a block diagram of an organic EL drive circuit representing one embodiment to which a D/A according to the present invention is applied, FIG. 2 is a circuit diagram of another concrete example of the D/A in FIG. 1 and FIG. 3 is a block diagram of an active matrix type organic EL drive circuit.

In FIG. 1, numeral 10 is a column driver of the organic EL drive circuit, 11 is a D/A therefor, 12 is a constant current source generating a reference drive current Ip, 13 is a constant voltage bias circuit, 14 is a peak current producing circuit, 15 is a control circuit and 16 is a register for memorizing display data.

The D/A 11 is constituted by a current mirror circuit 110 and another current mirror circuit 111 of which input side transistor is not diode connected. The constant voltage bias circuit 13 biases at a constant voltage common gates of transistors constituting the current mirror circuit 111. Thereby, the current mirror circuit 111 constitutes a current diversion circuit block in which the input side transistor and plural output side transistors forms current diverting passages.

The current mirror circuit 110 is a current mirror circuit constituted by input side transistors TNa and TNp of N channel MOS and output side transistors TNb~TNg of N channel MOS. The input side transistor TNp is provided in parallel with the input side transistor TNa.

The respective output side transistors TNc~TNg are provided corresponding to respective digit positions of upper 5 bits (D3~D7) among 8 bits display data, the respective drains thereof generate analog conversion currents corresponding to the respective digit positions and the total value of currents flowing through the respective drains corresponds to analog conversion current of the upper 5 bits.

Between the drains of the respective output side transistors TNc~TNg and an output line 114, N channel MOSFET transistors Trc~Trg are provided as switch circuits, and then the gates of the transistors Trc~Trg are respectively connected to respective input terminals D3~D7 for upper 5 bit display data.

Herein, the respective transistors Trc~Trg constitute the respective switch circuits and ON/OFF of these transistors is determined in response to display data at D3~D7 sent out from the register 17. The display data at D3~D7 correspond to upper 5 digits with digit weights of 1, 2, 4, 8 and 16 from unit digit position to fifth digit position. On the other hand, display data at D0~D2 for the lower 3 bits are fed to switch circuits SW1a~SW3a and SW1b~sw3b in the current mirror circuit 111.

Further, the display data of 8 bits at D0~D7 are set in the register 16 from an MPU in response to a latch pulse LP from the control circuit 15.

The current mirror circuit 111 is constituted by an input side transistor QN1 of N channel MOS and output transistors QN2~QN4 of N channel MOS and the sources of these transistors QN1~QN4 are connected to the drain of the output side transistor TNb via the drain-source of the transistor Trb. Thereby, the transistors QN1~QN4 locate at upstream of the output side transistor TNb. Further, the output side transistor TNb is a concrete example of the other output side transistor in the present invention.

Although the transistor Trb is one of switch circuits corresponding to respective transistors Trc~Trg provided upstream the output side transistors TNc~TNg, since the gate thereof is connected to a predetermined bias Va, the transistor is normally kept under ON state. Therefore, even with no provision of the transistor Trb, the current mirror 111 can be connected directly upstream the output stage transistor TNb, however, the provision of the transistor Trb gives a good circuit balance for the D/A.

Further, the respective back gates of the input side transistors TNa and TNp of N channel, the output side transistors TNb~TNg and Trc~Trg are connected to the ground GND.

In the current mirror circuit 110, the source of the input side transistor TNa is connected to the ground GND and the source of the input side transistor TNp is connected to the ground GND via a switch circuit SW. Further, the gates of the respective transistors TNa,TNp and TNb~TNg are connected in common and the respective gates and drains of the transistors TNa and TNp are connected to an input terminal 11a of the D/A 11. Thereby, the transistors TNa and TNP are diode connected and these two transistors constitute the input side transistors for this current mirror circuit.

Further, the switch circuit SW receives a control pulse CONT from the control circuit 15 via an inverter 15a and is turned ON/OFF.

Herein, since the output side transistor TNb and the current mirror circuit 111 provided upstream thereof are cascade connected between the power source voltage line and the ground line, total current of the currents having been flown through the respective transistors QN1~QN4 in the current mirror circuit 111 flows through the output side transistors TNb.

In the current mirror circuit 111, the input side transistor QN1 is not diode connected, but the bases of the input side transistor QN1 and the plural output side transistors QN2~QN4 are connected in common, the commonly connected bases are biased at a predetermined constant voltage by the constant voltage bias circuit 13 and the current flowing downstream to the output side transistor TNb is diverted to the transistors QN11~QN4. Thereby, this circuit constitutes a weighting current circuit block of binary system load formed by transistor cells having internal impedance of same value in place of a weighting current circuit of binary weighting formed by a resistor network.

The drains of the output transistors QN2~QN4 are respectively connected to a terminal formed by commonly connecting the respective one terminals of a pair of switch circuits SW1a and SW1b, a terminal formed by commonly connecting the respective one terminals of a pair of switch circuits SW2a and SW2b and a terminal formed by commonly connecting the respective one terminals of a pair of switch circuits SW3a and SW3b, each is constituted by an N channel MOS transistor like the transistors Trc~Trg.

The other terminals of the switch circuit SW1a, the switch circuit SW2a and the switch circuit SW3a are connected to the output line 114. The output line 114 is connected to an output line of the D/A 11. The other terminals of the switch circuit SW1b, the switch circuit SW2b and the switch circuit SW3b are connected to the power source line 113. The power source line 113 is connected to a regulator power source 112.

Thus, a same current flows through the respective transistors in response to stabilized constant voltage of the regulator power source 112. Thereby, current having current value corresponding to the number of selected cell transistors is fed from the regulator power source 112 to the current mirror circuit 111 via the power source line 113. Further, the current mirror circuit 111 sinks the current having current value corresponding to the number of selected cell transistors from the input terminal 11a and outputs the same from the output terminal 11b.

Numerals x1, x2, x4, shown at the side of the transistors QN2~QN4 show number of cells (herein below will be called as cell number) of transistor cells connected in parallel.

Since the common bases of the transistors QN1~QN4 receive a predetermined constant voltage bias from the bias circuit 13, the impedances (resistances) of the respective transistor cells constituting the respective transistors QN1~QN4 are set at substantially the same constant value. Thereby, the current mirror circuit 111 can distribute the current flowing through the downstream output side transistor TNb at a predetermined ratio corresponding to the number of transistor cells constituting the respective transistors QN1~QN4. This is because the respective transistor cells are formed into an IC as assuming that their characteristics are substantially the same.

Because the current mirror circuit 111 receives at the common bases a predetermined constant voltage bias from the bias circuit 13, current diverting circuits having m pieces of diverting passages in which transistors having same internal impedance are connected in parallel depending on the digit weights of the lower m digits (however, a current diverting circuit corresponding to the lowest position digit weight has no parallel connection) are formed by the output side transistors QN2~QN4, and in addition thereto, the current diverting circuit corresponding to the lowest position digit weight is added by the input side transistor QN1 and is formed to the above to thereby constitute the weighting current circuit block (current diversion circuit block).

The respective output side transistors QN2~QN4 respectively correspond to respective digit positions of the lower m digits in the display data (data to be converted).

The drain of the input side transistor QN1 is connected to the side of the power source line 113 via the switch circuit SWb and the switch circuit SWb is set under normally ON state. Further, the drain of the input side transistor QN1 is connected to the output line 114 via the switch circuit SWa and the switch circuit SWa is set under normally OFF state. As a result, the drain of the input side transistor QN1 is connected to the regulator power source 112 via the output line 113 and the current flowing there through normally flows to the downstream output side transistor TNb.

The switch circuits SW1a and SW1b, the switch circuits SW2a and SW2b and the switch circuits SW3a and SW3b respectively receive display data at D0~D2 and are turned ON/OFF. The display data at D0~D2 respectively correspond to digit weights of the lower 3 digit positions below the unit digit position, namely, correspond to ⅛, ¼ and ½.

The switch circuits SW1a and SW1b, the switch circuits SW2a and SW2b and the switch circuits SW3a and SW3b are respectively constituted by transistors like the transistors Trc~Trg and the gates of one transistors in the pairs of switch circuits respectively receive the display data at D0~D2 via respective inverters 17a, 17b and 17c. Thereby, the ON/OFF operation of the switch circuits SW1a and SW1b, the switch circuits SW2a and SW2b and the switch circuits SW3a and SW3b is performed complementarily and the drains of the output side transistors Qn2~QN4 are selectively connected either the regulator power source 112 or the output terminal 11b of the D/A 11. Accordingly, these switch circuits SW1a~SW3a and switch circuits SW1b~SW3b constitute a change over circuit that changes over the current from the regulator power source 112 and the current from the output terminal 11b of the D/A 11 to be sunk.

The output terminal 11b of the D/A 11 is connected to an input of the output stage current source 1 and the D/A 11 current drives the output stage current source 1. The output stage current source 1 is usually constituted by a current mirror circuit. The input side transistor thereof is driven by the D/A 11, the current generated at the output side transistor thereof is fed to a positive electrode of an OEL element 3 via a terminal pin 2 of the organic EL panel to current drive the same in a case of passive matrix type. Further, although the negative electrode of the OEL element 3 is normally grounded via a row side drive circuit, since the row side drive circuit is not directly related to the present invention, herein, the negative electrode of the OEL element 3 is assumed to be grounded as illustrated.

Numerals x1, x2, x4, ... shown at the side of the respective transistors TNa, TNp and TNc~TNg show also the cell number of transistor cells connected in parallel. The case of x1 shows no parallel connection. In response to the cell number, the output side transistors TNc~TNg and the output side transistors QN2~QN4 generate respective output currents of analog converted currents corresponding to the digit weights in the display data at D0~D7. Since the output side transistors TNb and TNc bear x1, the operating currents flowing therethrough are the same.

Since the output side transistors TNb and TNc bear x1, the current having the same current value Ip as in the input side transistor TNa flows therethrough. Therefore, to the input side transistor QN1 and the output side transistors QN2~QN4 in the current mirror circuit 111 the current having current value Ip of the transistor TNb diverts.

Namely, the current having current value Ip of the current from the regulator 112 flowing to the output side transistor TNb via the power source line 113 diverts and flows to the input side transistor QN1 and the output side transistors QN1~QN4. At this time, the current having current value Ip is diverted depending on the ratio of operating currents of these transistors. The input side transistor QN1 is x1 and the output side transistors QN2~QN4 are respectively x4, x2 and x1. Since the total cell number is x8, current having current value of Ip/8 flows to the transistor QN1, current having current value of Ip/2 flows to the transistor QN2, current having current value of Ip/4 flows to the transistor QN3 and current having current value of Ip/8 flows to the transistor QN4. These current values correspond to the analog converted current values for the lower position digits below the unit position.

Herein, since to the transistor QN1 in the added current diverting circuit current having current value Ip/8 always flows from the regulator power source 112, the current having current value of Ip, which is the total value of the respective diverting currents, flows to the downstream output transistor TNb. As a result, since the current value of the current flowing to the output side transistor TNb gives the same current value Ip in the input side transistor TNa, the D/A conversion accuracy can be enhanced.

Further, the operating current ratio of the respective transistors QN1~QN4 is QN1:QN2:QN3:QN4=1:4:2:1.

Now, when considering the cells connected in parallel by the cell numbers x4, x2 and x1 in the respective transistors QN1~QN4, since the internal impedances of the respective cell transistors are the same, the same current having current value Ip/8 flows through the respective cell transistors. As a result, the current mirror circuit 111 constitutes a D/A conversion circuit in a form of a weighting current circuit of binary weighting having resolution of current value Ip/8.

The regulator power source 112 is fed electric power from a power source line +VDD and generates stabilized voltage of about 1.5V~2.0V. As shown in FIG. 1, when MOS transistors are piled up in about 4 stages between the potential of the power source and the ground GND, the D/A 11 is fully operable as a D/A conversion circuit with the power source voltage of about 1.5V~2.0V.

When all of the switch circuit SW1b, the switch circuit SW2b and the switch circuit SW3b are in ON state, the respective diverting currents in the current mirror 111 are fed from the regulator power source 112 to the transistor TNb in the downstream current mirror circuit 110 via the input side transistor QN1 and the output side transistor QN2~QN4. At this moment, the switch circuit SW1b, the switch circuit SW2b and the switch circuit SW3b receive display data "000" at D0~D2 and are respectively turned ON, and the switch circuit SW1a, the switch circuit SW2a and the switch circuit SW3a are oppositely turned OFF.

Herein, any of the switch circuit SW1a, the switch circuit SW2a and the switch circuit SW3a corresponding to a digit position showing "1" among display data at D0~D2 is turned ON and any of the output transistors QN2~QN4 corresponding to the digit position showing "1" is connected to the output terminal 11b. Oppositely, any of the switch circuit SW1b, the switch circuit SW2b and the switch circuit SW3b corresponding to the digit position showing "1" is turned OFF and any of the output transistors QN2~QN4 corresponding to the digit position showing "1" is disconnected from the regulator power source 112.

For example, assuming that the display data at D0~D2 shows "001" and the turned ON switch circuit is the switch circuit SW1a, the switch circuit SW1a connects the drain of the output side transistor QN2 to the output terminal 11b. Thereby, current having current value Ip/2 (=4xIp/8) is sunk from the output terminal 11b.

Namely, in response to display data at D0~D2, any one or more currents having current values of QN2=Ip/2, QN3=Ip/4 and QN4=Ip/8 can be selected as analog converted current and taken out to the output terminal 11b.

Accordingly, the pair of switch circuits SW1a and SW1b, the pair of switch circuits SW2a and SW2b and the pair of switch circuits SW3a and SW3b constitute the selection circuit for selecting the diverting currents.

Herein, the fourth digit position (D3) from the last is the position of unit digit. When assumed that the display data is 8 bits, it is desirable to set the position of the unit digit at a digit position corresponding to a substantial center position when dividing the 8 bits into upper and lower two portions (when assuming that the display data is m bits, and when m is an even number, m/2 is the position of unit digit and when m is an odd number, the center in m is the position of unit digit). Accordingly, the fourth digit position (D3) from the last is set as the position of unit digit. By determining the digit position corresponding to a substantial center position as a position of unit digit, for the positions of lower digits than the unit digit the output side transistor TNb is provided and this output side transistor TNb is assigned as a transistor that diverts the own current (of which current value is the same as the current value Ip at the position of unit digit).

Thereby, the digit weight of 128 at the highest digit can be reduced down to 16 by shifting 3 digit components below the position of unit digit. Usually, the digit weight at the highest digit position of 8 bits is 128, the digit weight at the second highest digit position is 64, in that the digit weight increases in double when the digit increase by one, however, through provision of the current mirror circuit for the digit positions at D0~D2 at the upstream as in the present embodiment, when the current of the output side transistor TNb is diverted to the current mirror circuit 111 to produce therein many currents having current values corresponding to the digit weights lower than the unit digit, the number of cell transistors corresponding to the highest digit in the current mirror circuit 110 is 16 and the number of cell transistors in the current mirror circuit 111 is sufficient by about 16.

Namely, when the respective output side transistors in the upstream current mirror circuit produce currents having current values corresponding to the digit weights of the lower digits than the unit digit, a possible increase of the number of the output side transistors can be suppressed. Further, the cell number of the output side transistor TNb can be changed to x2 to modify the current thereof as same as the current having current value 2Ip for the fifth digit (D4) from the last. In this instance, diverting current having current value of Ip/4 flows through the transistor QN1, diverting current having current value of Ip flows through the transistor QN2, diverting current having current value of Ip/2 flows through the transistor QN3 and diverting current having current value of Ip/4 flows through the transistor QN4. Accordingly, the transistor QN2 generates a diverting current for the unit digit and as a whole 7 bits are covered. Therefore, the transistor for unit digit in the current mirror circuit 110 is unnecessitated and the upper digits cover 4 bits.

In the manner as explained above, the digit weights for the lower digits can be easily produced by distributing the current flowing through the downstream output side transistors to the input side transistor and output side transistors in the current mirror circuit provided at the upstream on the ratio of the channel widths thereof (or the ratio of gate widths). Then, currents of powers of 2 or of 1/powers of 2 distributed by the upstream current mirror circuit 111 are output at the output terminal 11b of the D/A 11.

In the above embodiment, since the digit weights of currents sunk from the output terminal 11b are set as ⅛, ¼ and ½, the currents corresponding to these digit weights are generated at respective digit positions below the position of unit digit. At this time, the current flowing through the downstream transistor TNb is a merged current of the currents distributed by the current mirror circuit 111, namely, the total operating current in the current mirror circuit. The current value of the operating current is Ip as same as that flowing through the transistor TNe for the fourth digit (D3) from the last. In order to perform such operation, the one added current diverting circuit constituted by the transistor QN1 is required.

In such D/A constituted by piling up the current mirror circuits in upstream and downstream relation, the voltage between the drain-source of the transistors TNb~TNd can be reduced lower than that of a D/A obtained by directly diverting the currents corresponding to the digits below the unit digit by a single current mirror circuit. Moreover, since the value of current in the transistor TNb corresponds to that of the drive current flowing through the transistor TNa and the transistor TNp, the accuracy of the analog current value obtained by the D/A conversion is high.

In the above embodiment, the value of current flowing through the transistors TNb~TNc is Ip as same as in the input side transistor TNa, since the currents are substantially equal, the current conversion accuracy for the lower digit positions from the fourth digit (D3) from the last is enhanced. Further, since the number of cells connected in parallel for the highest digit is remained limited to 16, the current conversion accuracy is enhanced accordingly.

Now, the D/A 11 according to the above embodiment, the value of the analog converted current generated at the output side transistor is reduced small by the amount of shifting toward lower digit position. However, when the drive current in the input side transistor is increased accordingly, the analog converted current at the digit position before shifting can be obtained at the shifted lower digit position. What generates such drive current at the input side transistor is the constant current source 12.

The constant current source 12 is, for example, connected to the low voltage power source line +VDD of about +3V and sends out the drive current Ip to the transistor TNa and the transistor TNp provided downstream thereof via the input terminal 11a.

The constant current source 12 corresponds to an output current source in a reference current distributing circuit. The reference current distributing circuit receives a reference current at input side transistors constituted in a current mirror circuit and distributes the reference current as a mirror current to many output side transistors provided in parallel corresponding to the output terminal pins. The distributed reference current or the reference drive current (an amplified reference current) generates a peak current in the drive current for the OEL element 3 at an initial drive period of the OEL element 3. The current value for producing the corresponding peak current is the drive current value Ip. The drive current having value Ip is output from the respective output side transistors in the current mirror circuit provided in the reference current distributing circuit to the input side transistor TNa in the respective D/As 11. Further, the constant current source 12 is usually constituted by a single P channel MOS transistor and the source thereof is connected to the power source line +VDD and the drain thereof is connected to the input terminal 11a.

As shown in FIG. 1, at the downstream of the input side transistor TNp provided in parallel with the input side transistor TNa, the switch circuit SW is provided. The switch circuit SW receives an inverted signal of a control pulse CONT via an inverter 15a. A control circuit 15 generates the control pulse CONT of HIGH level ("H") at an initial drive period of the OEL element 3 for a predetermined interval. Thereby, the switch circuit SW is turned OFF at the initial drive period and the analog converted current producing the peak current is generated at the D/A 11. Thereafter, when the control pulse CONT is stopped and is rendered LOW level ("L"), the switch circuit SW receives the inverted signal "H" and is turned ON. Thereby, the drive current having value of Ip is diverted to the transistor TNp and flows through the transistor TNa and the transistor TNp, and the drive current at the input side is rendered to Ip/10 and the drive current for the OEL element 3 drops to a normal current from the peak current at the initial drive period.

Accordingly, with the above measure, although the conversion bit number is 8 bits, the digit weight for the highest digit in the D/A 11 is sufficient by x16. Thereby, a possible variation of the input currents for upper digit positions exceeding fourth digit (D3) from the last can be suppressed.

FIG. 2 is a circuit of another embodiment of a D/A 21, wherein the current mirrors 111 are piled up in two stages. In other words, in place of the current mirror circuit 111 in FIG. 1, current mirror circuits 111a and 111b are provided at the upstream of the current mirror circuit 110.

Further, in FIG. 2, the respective switch circuits each constituted by a transistor in FIG. 1 are illustrated simply by switches and the circuit of the D/A circuit 21 is illustrated in a simplified manner. Further, the constant voltage bias circuit 13 is divided as constant bias circuits 13a and 13b and such as the regulation power source 112 is also simplified as a simple power source. The voltage of the regulation power source 112 is preferable at about 2.0V~2.5V in the present embodiment.

For the convenience of explanation, in FIG. 2, the transistor QN1 in the current mirror circuits 111a and 111b, which is illustrated in the right most position in FIG. 1, is moved to the left most position. The switch circuits SWa and SWb for the transistor QN1 in the current mirror circuit 111a are omitted and the transistor QN1 in the current mirror circuit 111b is illustrated as directly grounded.

In the D/A 21, the current mirror circuit 111a is provided at the upstream of the transistor TNb. Then, at the upstream of the output side transistor QN1 in the current mirror circuit 111a the current mirror circuit 111b is provided.

The current mirror circuit 111b is a similar circuit as the current mirror circuit 111 and a transistor equivalent to the transistor TNb at the downstream of the current mirror circuit 111a constitutes the output side transistor QN1 in the current mirror circuit 111a.

Thereby, since the current value of the output side transistor QN1 at the downstream of the current mirror circuit 111b gives Ip/8, the distributed currents of the respective transistors QN1~QN4 in the current mirror circuit 111b assume as QN1=Ip/(8×8), QN2=Ip/(2×8), QN3=Ip/(4×8) and QN4=ip/(8×8). As a result, the digit weights of the transistors QN2, QN3 and QN4 in the current mirror circuit 111b are rendered as 1/16, 1/32 and 1/64, thereby, analog converted currents corresponding to these digit weights are generated in the current mirror circuit 111b.

Further, in the D/A 21 of the present embodiment, the conversion bit number increases further by 3 bits at the lower digit positions. The display data of conversion object give as a whole 11 bits of D0~D10. 3 bits in the display data D0~D2 among the display data D0~D10 are applied to the current mirror circuit 111b, 3 bits in the display data D3~D5 are applied to the current mirror circuit 111a and 5 bits in the display data D6~D10 are applied to the current mirror 110. In the drawing the illustration thereof is omitted.

FIG. 3 is still another embodiment in which the output terminal 11b of the D/As 11 functions as an output of current sink, the output stage current source 1 is eliminated and the output terminal 11b of the D/As 11 is directly connected to the terminal pin 2 of the active matrix type organic EL panel. The D/As 11 are connected via the output terminals 11a to the terminal pins 2 for the data lines X (X1~Xn) of a pixel circuit 4 in an organic EL panel 101 to drive the active matrix type organic EL panel.

Numeral 100 is a current drive circuit for the D/As 11 provided corresponding to the output terminals 2 and is controlled by the MPU 6. The control circuit 15 is controlled by the MPU 6 and sends out timing control signals T1 and T2 to a writing control circuit 5.

As shown in FIG. 3, the pixel circuits (display cells) 4 are provided at corresponding crossing points of X and Y matrix wirings (data lines X1, Xn, scanning lines Y1, Y2, . . . ). In the pixel circuit 4, N channel MOS transistors Tr1 of which source side and gate are connected to the respective crossing points of the respective data lines and the respective scanning lines Y1. An OEL element 4a is driven by a drive transistor Tr2 of P channel MOS. Between the source-gate of the transistor Tr2 a capacitor C is connected. The source of the transistor Tr2 is connected to a power source line +Vcc of, for example, about +7V and the drain side thereof is connected to the positive electrode of the OEL element 4a. The negative electrode of the OEL element 4a is connected to a switch circuit 7a in a row side scanning circuit 7 and is connected to the ground via the switch circuit 7a.

In the pixel circuit 4, between the transistor Tr1 and the transistor Tr2, a P channel MOS transistor Tr3 and N channel MOS transistor Tr4 are provided. The transistor Tr3 constitutes an input side transistor in a current mirror circuit 4b in which the transistor Tr2 constitutes the output transistor therefor. At the downstream of the transistor Tr3, the drain thereof is connected to the drain of the transistor Tr1. The transistor Tr4 is connected via the source and drain thereof between the connection point of the transistor Tr3 and the transistor Tr1 and a common gate (the gate of the transistor Tr2) of the current mirror circuit 4b.

The gate of the transistor Tr1 is connected via the scanning line Y1 (writing line) to the writing control circuit 5 and the gate of the transistor Tr4 is connected via the scanning line Y2 (erasing line) to the writing control circuit 5. The writing control circuit 5 drives and scans the scanning line Y1 (writing line) and the scanning line Y1 (erasing line) in response to the control signals T1 and T2 and when these scanning lines are rendered "H", both transistor Tr1 and transistor Tr4 are turned ON. Thereby, the transistor Tr2 is driven with a predetermined drive current as well as the capacitor C is charged and a predetermined drive voltage is held in the capacitor C.

As a result, a drive current value is written in the capacitor C. At this moment, the capacitor C memorizes the same as a voltage value. Further, a peak current is caused to flow to the capacitor C at the initial period of the charging in response to a control pulse CONT from the control circuit 15.

The MOS transistor Tr2 is current driven depending on the voltage memorized in the capacitor C. The voltage memorized in the capacitor C at this moment shows a voltage value corresponding to the drive current at the time of writing and the OEL element 4a is current driven by the current having corresponding drive current value at the time of writing. When the channel widths of the transistor Tr2 and transistor Tr3 are equal, a drive current as same as the writing current can be generated.

In the current mirror circuit 111 in the respective embodiments above, although the transistors Trb~Trd constituting the switch circuits are provided at the upstream with respect to the output side transistors TNb~TNg in the current mirror circuit constituting the D/A, The transistors Trb~Trd can be provided at the downstream of the respective output side transistors.

Further, for the D/A in the embodiments, although ones of 8 bits and 11 bits are exemplified, the present invention is of course applicable to D/As having conversion digit number of 9 bits, 10 bits or more than 11 bits.

Still further, in the current mirror circuits 110 and 111, although the switch circuits are respectively provided in series with the respective output side transistors, these respective switch circuits can be also provided at the downstream of the respective transistors.

INDUSTRIAL APPLICATION

As has been explained hitherto, in the embodiments, although the weighting current circuit block of binary weighting is formed by the current mirror circuit of which input side transistor is not diode connected, the weighting current circuit block of binary weighting of the present invention is not necessarily limited to one constituted by a current mirror circuit.

Further, although the D/A in the embodiments is primarily constituted by N channel MOS transistors, the D/A can of course be constituted by P channel transistors or a combination with N channel MOS transistors. Still further, these transistors can be bipolar transistors. Further, in such instance, the gate corresponds to the base thereof, the source corresponds to the emitter thereof, the drain corresponds to the collector thereof and the ratio of the channel widths in the transistor corresponds to the ratio of the emitter areas.

EXPLANATION OF REFERENCE NUMERALS

Figure 1:
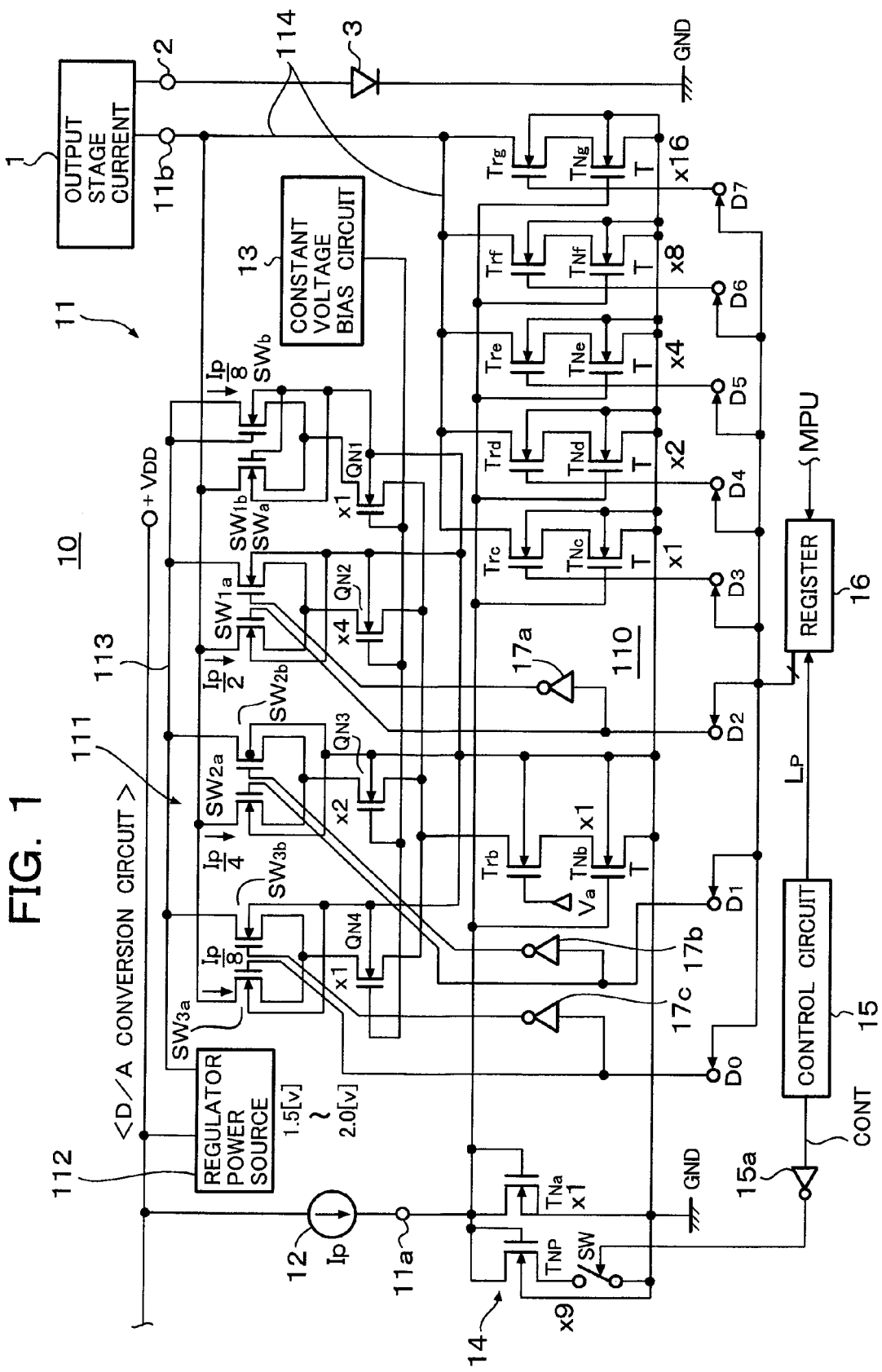
FIG. 1 is a block diagram of an organic EL drive circuit representing one embodiment to which a D/A of the present invention is applied.
Figure 2:
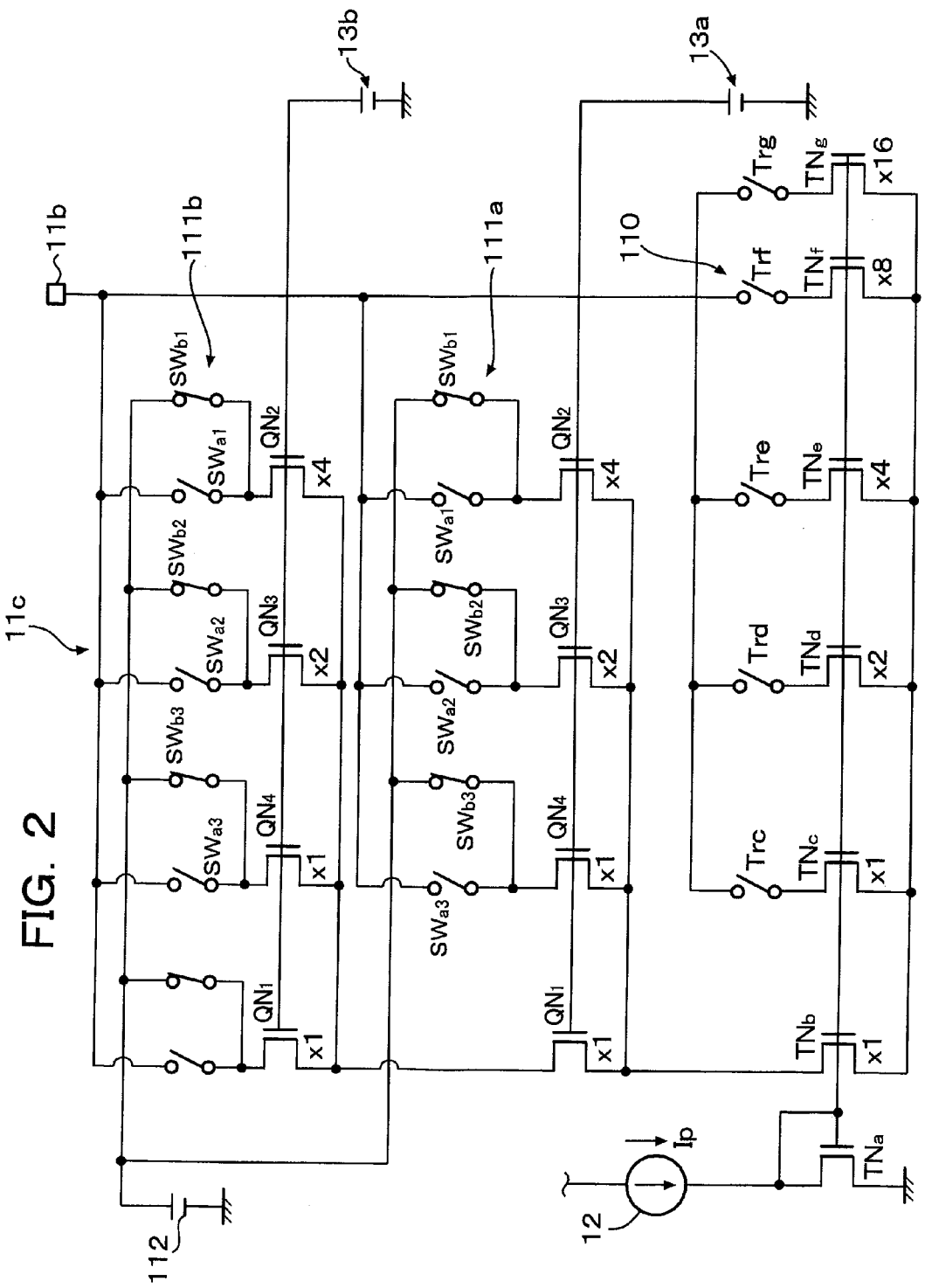
FIG. 2 is a block diagram of another embodiment.
Figure 3:
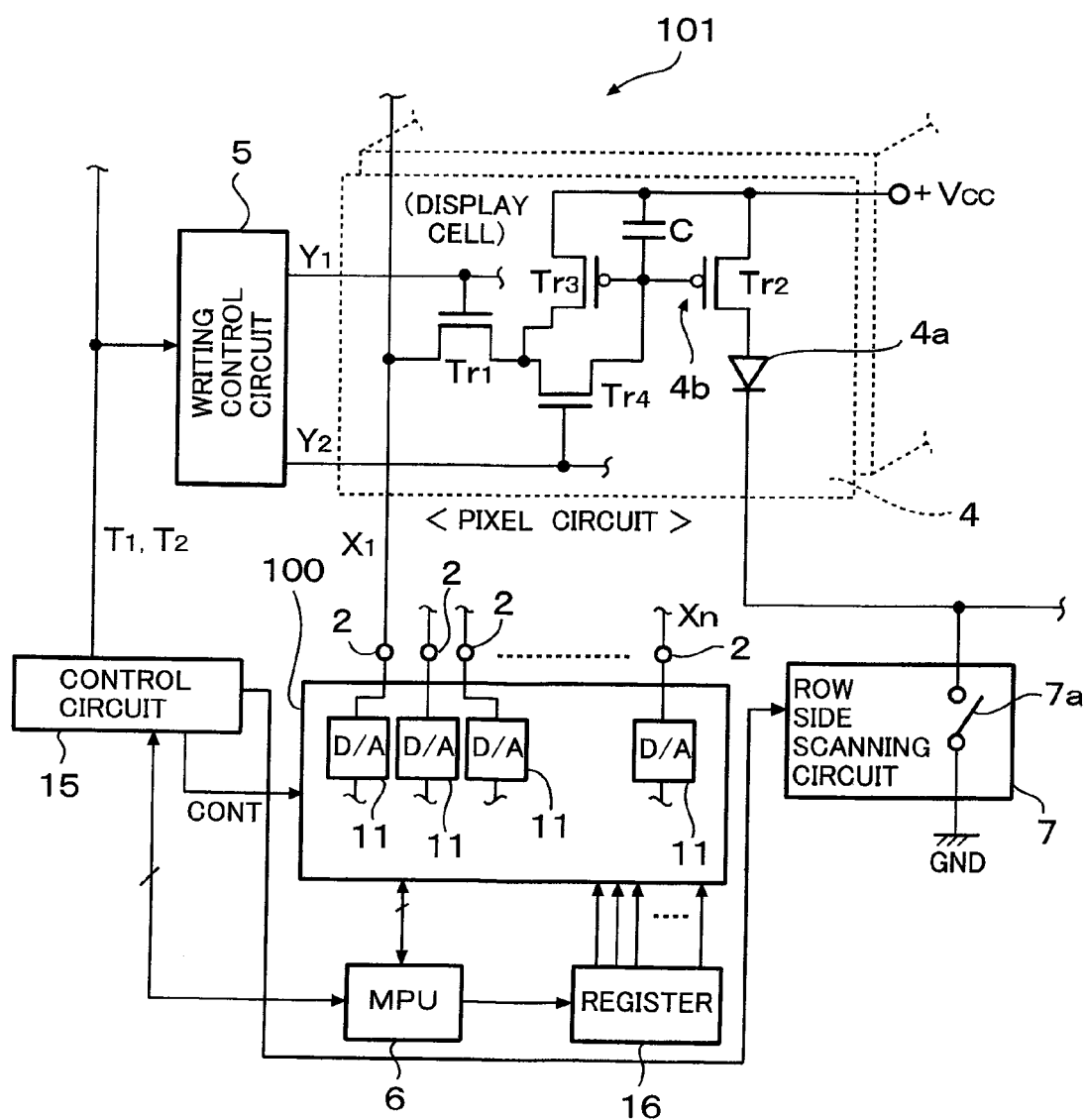
FIG. 3 is a block diagram of an active matrix type organic EL drive circuit.

1 . . . Output stage current source,
2 . . . Terminal pin,
3, 4a . . . OEL element,
4 . . . Pixel circuit,
5 . . . Writing control circuit,
6 . . . MPU,
7 . . . Row side scanning circuit,
10 . . . Column driver,
11, 21 . . . D/A conversion circuit (D/A),
12 . . . Constant current source,
13 . . . Constant voltage bias circuit,
14 . . . Peak current producing circuit,
15 . . . Control circuit,
15a . . . Inverter,
16, 17 . . . Register,
110, 111, 111a, 111b . . . Current mirror circuit,
112 . . . Regulator power source,
113 . . . Power source line,
114 . . . Output line,
TNa~TNg, QN1~QN5, Trb~Trg . . . N channel MOS transistor,
SW1a, SW1b, SW2a, SW2b, SW3a, SW3b . . . Switch circuit.

The invention claimed is:

1. A D/A converter constituted by a current mirror circuit for D/A converting data to be converted, wherein the current mirror circuit includes a first current mirror circuit that D/A converts upper (n–m) digits in the data of n bits to be converted (wherein, n is an integer equal to or more than 4, m is an integer equal to or more than 2 and (n–m) is an integer equal to or more than 2) and a weighting current circuit block that D/A converts lower m digits in the data, and the weighting current circuit block is provided with at least m pieces of current diverting circuits which are cascade connected at the upstream or the downstream of one of other output side transistors than output side transistors for the D/A conversion in the first current mirror circuit and cause to flow currents flowing through the other output side transistors as diverting currents corresponding to current values of respective digit weights in the lower m digits and a selection circuit that selectively outputs the respective diverting currents flowing respectively through the m pieces of current diverting circuits to output terminals for analog converted currents in the first current mirror circuit.

2. A D/A conversion circuit according to claim 1, wherein the selection circuit includes plural switch circuits for selecting the diverting currents in response to data value in the lower m digits and the plural switch circuits are provided respectively corresponding to the m pieces of current diverting circuits.

3. A D/A conversion circuit according to claim 2, wherein the selection circuit, in order to keep current having been flown to the other output side transistor or current to be flown thereto at a constant value, further includes another current diverting circuit that receives current from a predetermined current source and feeds current to the other output side transistor and the plural switches are plural change over circuits that respectively change over the current from the predetermined current source and the diverting currents to be outputted to the output terminals and cause to flow the same to the m pieces of current diverting circuits.

4. A D/A conversion circuit according to claim 3, wherein the weighting current circuit block is constituted by a second current mirror circuit in which bases therein are connected in common and an input side transistor is not diode connected, the commonly connected bases are set at a predetermined constant voltage, the output side transistors of the second current mirror circuit form the m pieces of the current diverting circuits and the input side transistor of the second current mirror circuit forms the other current diverting circuit.

5. A D/A conversion circuit according to claim 4, wherein the first current mirror circuit includes switch circuits respectively connected in series with the plural output side transistors thereof, these switch circuits are turned ON/OFF in response to the data in the upper (n−m) digits, the plural change over circuits are respectively connected in series with the respective output side transistors of the second current mirror circuit and the lower m digits correspond to lower digit weights than unit digit.

6. A D/A conversion circuit according to claim 1, wherein the m pieces of current diverting circuits are respectively constituted by number of transistor cells corresponding to respective digit weights of the lower m digits and the internal impedances of the respective transistor cells are set to show a same value.

7. An organic EL drive circuit that current drives an organic EL element by an output current of a D/A conversion circuit according claim 1.

8. An organic EL drive circuit comprising a D/A conversion circuit according to claim 1 and a current source that receives an output current of the D/A conversion circuit to be driven thereby and current drives an organic EL element.

9. A D/A conversion circuit that includes a current mirror circuit having plural output side transistors respectively provided corresponding to respective digit positions of data to be converted of n bits (n is an integer equal to or more than 4) and produces an analog converted current by obtaining current depending on the digit weight corresponding to the digit position of the data to be converted from at least one of the plural output side transistors in response to the data to be converted, wherein the current mirror circuit is constituted by a first current mirror circuit and a second current mirror circuit of which input side transistor is not diode connected, the first current mirror circuit includes plural output side transistors each of which corresponds to respective digit positions of upper (n−m) digits in the data to be converted (wherein m is an integer equal to or more than 2 and (n−m) is an integer equal to or more than 2) and another output side transistor provided in parallel with the plural output side transistors, and the plural output side transistors respectively generate respective currents corresponding to current values of respective digit weights in the (n−m) digits, the second current mirror circuit is cascade connected at the upstream side or at the downstream side of the other output side transistor and the bases of the input side transistor thereof and the plural output side transistors thereof connected in parallel are set at a predetermined constant voltage, and by distributing current having been flown through the other output side transistor or current to be flown thereto to the input side transistor of the second current mirror circuit and the plural output side transistors thereof, the plural output side transistors of the second current mirror respectively generate respective currents corresponding to the current values of respective digit weights in the m digits.

10. A D/A conversion circuit according to claim 9, further includes plural change over switch circuits each provided for the respective corresponding plural output side transistors of the second current mirror circuit and for outputting the respective diverting currents distributed respectively to the respective plural output side transistors of the second current mirror circuit to output terminals of the analog converted currents, wherein, in order to keep current having been flown to the other output side transistor or current to be flown thereto at a constant value, the input side transistor of the second current mirror circuit causes to flow current fed from a predetermined electric power supply line to the other output transistor and the change over switch circuits receive a predetermined current from the electric power supply line and change over the same with the diverting currents to be outputted to the output terminals respectively to flow the current having been flown to the other output side transistor or the current to be flown thereto to the input side transistor and the plural output side transistors of the second current mirror circuit.

11. A D/A conversion circuit according to claim 10, wherein the first current mirror circuit includes switch circuits respectively connected in series with the plural output side transistors thereof, these switch circuits are turned ON/OFF in response to the data in the upper (n−m) digits, the plural change over switch circuits are respectively connected in series with the respective output side transistors of the second current mirror circuit and operate in response to data value in the lower m digits and the lower m digits correspond to lower digit weights than unit digit.

12. A D/A conversion circuit according to claim 11, wherein the plural change over switch circuits respectively include a first switch circuit and a second switch circuit, the first switch circuit is provided between one of the respective plural output side transistors of the second current mirror circuit and the output terminals and the second switch circuit is provided between one of the respective plural output side transistors of the second current mirror circuit and the predetermined electric power supply line.

13. A D/A conversion circuit according to claim 12, wherein when n is an even number, n/2 is the position of unit digit and when n is an odd number, the center in n is the position of unit digit.

14. A D/A conversion circuit according to claim 13, wherein the n is equal to or more than 8 bits.

15. A D/A conversion circuit according to claim 13, wherein digit number of the data to be converted is equal to or more than 8 bits and the data to be converted are display data subjected to γ correction.

16. A D/A conversion circuit according to claim 11, wherein the input transistors, the output transistors and the other output transistor in the first and second current mirror circuit are respectively MOS transistors and the input transistor and the plural output transistors of the second current mirror circuit are fed electric power from a predetermined power source via the predetermined electric supply line and currents having values of 1/powers 2 with respect to the current flowing through the other output transistor are respectively diverted to the input side transistor and the plural output side transistors of the second current mirror circuit.

17. A D/A conversion circuit according to claim 9, wherein the m pieces of current diverting circuits are respectively constituted by number of transistor cells corresponding to respective digit weights of the lower m digits and the internal impedances of the respective transistor cells are set to show a same value.

18. An organic EL display device comprising an organic EL drive circuit according to claim 17.

* * * * *